(12) United States Patent
Jang et al.

(10) Patent No.: US 9,040,211 B2
(45) Date of Patent: May 26, 2015

(54) MASK AND METHOD OF MANUFACTURING A SUBSTRATE USING THE MASK

(71) Applicant: Samsung Display Co., Ltd., Yongin, Gyeonggi-Do (KR)

(72) Inventors: Chang-Soon Jang, Seoul (KR); Soo-Hye Ryu, Yongin-si (KR); Yi-Seop Shim, Suwon-si (KR); Gwan-Soo Kim, Asan-si (KR); Chul Huh, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 95 days.

(21) Appl. No.: 13/773,400

(22) Filed: Feb. 21, 2013

(65) Prior Publication Data
US 2014/0045102 A1 Feb. 13, 2014

(30) Foreign Application Priority Data

Aug. 13, 2012 (KR) .................. 10-2012-0088388

(51) Int. Cl.
*G03F 1/00* (2012.01)
*G03F 7/00* (2006.01)

(52) U.S. Cl.
CPC ............... *G03F 7/0035* (2013.01); *G03F 7/00* (2013.01)

(58) Field of Classification Search
CPC ................................. G03F 1/08; G03F 1/0076
USPC ............................................. 430/5, 322, 394
See application file for complete search history.

(56) References Cited

U.S. PATENT DOCUMENTS

| 7,279,370 B2 | 10/2007 | Lim et al. | |
|---|---|---|---|
| 2009/0176325 A1* | 7/2009 | Jeon et al. | 438/34 |
| 2012/0094220 A1* | 4/2012 | Yoshiyasu | 430/5 |

FOREIGN PATENT DOCUMENTS

| KR | 10-2007-0071892 | 7/2007 |
|---|---|---|
| KR | 10-2007-0084911 | 8/2007 |
| KR | 10-2011-0104224 | 9/2011 |

* cited by examiner

*Primary Examiner* — Stephen Rosasco
(74) *Attorney, Agent, or Firm* — Innovation Counsel LLP

(57) ABSTRACT

A mask includes a substantially transparent portion. The mask further includes a halftone portion abutting the substantially transparent portion, a light transmittance of the halftone portion being greater than 0% and less than 100%. The mask further includes a blocking portion abutting the halftone portion, a light transmittance of the blocking portion being less than the light transmittance of the halftone portion.

9 Claims, 10 Drawing Sheets

MASK AND METHOD OF MANUFACTURING A SUBSTRATE USING THE MASK

CROSS-REFERENCE TO RELATED APPLICATION

This application claims priority to and benefit of Korean Patent Application No. 10-2012-0088388 filed on Aug. 13, 2012, the contents of which are incorporated herein by reference.

BACKGROUND OF THE INVENTION

1. Field of the Invention

The present invention is related to a mask and a method of manufacturing a substrate using the mask. substrate 2. Description of the Related Art Generally, a liquid crystal display apparatus includes a display panel for displaying an image and a light source module for providing a light to the display panel. For example, the display panel may be a liquid crystal display panel, and the light source module may be a backlight assembly.

The liquid crystal display panel may include a first substrate, a second substrate, and a liquid crystal layer disposed between the first substrate and the second substrate.

A gate pattern, a data pattern, a thin film transistor pattern, a black matrix pattern, a color filter pattern, a column spacer pattern, and so on may be formed on at least one of the first substrate and the second substrate.

For a display apparatus to have a sufficiently high resolution, the patterns may be required to be sufficiently small (or sufficiently fine) and sufficiently precise. Generally, the patterns may be formed using one or more photo resist processes, which may involve one or more exposure apparatuses.

Ideally, a light from an exposure apparatus is irradiated to a mask in a direction perpendicular to the mask. Nevertheless, in practice, the light from the exposure apparatus may be at least slightly inclined with respect to the mask. When the inclined light passes through small mask patterns, the light may irradiate an area wider than an area of an opening portion of the mask, and an area corresponding to the opening portion of the mask may receive an exposure with insufficient intensity due to diffraction and interference. Thus, a small pattern may not be precisely formed using a conventional exposure apparatus and a conventional mask.

BRIEF SUMMARY OF THE INVENTION

One or more embodiments of the invention may be related to a mask useful for forming a substantially precise fine pattern on a substrate for use in a display apparatus. The mask may include a substantially transparent portion (having a light transmittance substantially equal to 100%). The mask may further include a first halftone portion abutting the substantially transparent portion, a light transmittance of the first halftone portion being greater than 0% and less than 100%. The mask may further include a first blocking portion abutting the first halftone portion, a light transmittance of the first blocking portion being less than the light transmittance of the first halftone portion. In one or more embodiments, the light transmittance of the first blocking portion may be substantially equal to 0%.

In one or more embodiments, the mask may include a second halftone portion abutting the substantially transparent portion, a light transmittance of the second halftone portion being greater than 0% and less than 100%. The mask may include a second blocking portion abutting the second halftone portion, a light transmittance of the second blocking portion being less than the light transmittance of the second halftone portion. The substantially transparent portion may be disposed between the first halftone portion and the second halftone portion. The first halftone portion is disposed between the first blocking portion and the substantially transparent portion.

In one or more embodiments, the light transmittance of the first halftone portion is in a range of about 10% to about 20%.

In one or more embodiments, a width of the first halftone portion is in a range of half of a width of the substantially transparent portion to the width of the opening portion.

In one or more embodiments, the mask may include a second halftone portion abutting the substantially transparent portion. A light transmittance of the second halftone portion may be greater than 0% and less than 100%. The first blocking portion may be disposed between the first halftone portion and the second halftone portion. The substantially transparent portion may surround the first blocking portion, the first halftone portion, and the second halftone portion.

In one or more embodiments, the first blocking portion may have a rectangular shape. The first halftone portion may have a rectangular shape and may surround the first blocking portion. The substantially transparent portion may surround the first halftone portion.

In one or more embodiments, the substantially transparent portion may have a circular shape. The first halftone portion may have a circular shape and may surround the substantially transparent portion.

In one or more embodiments, the substantially transparent portion may have a circular shape. The first halftone portion may have a rectangular shape and may surround the substantially transparent portion.

In one or more embodiments, the mask may include a second substantially transparent portion. The first halftone portion may further surround the second substantially transparent portion. A portion of the first halftone portion may be disposed between the substantially transparent portion and the second substantially transparent portion.

One or more embodiments of the invention may be related to a method of manufacturing a substrate for use in a display apparatus. The method may include forming a first photo resist layer on a base substrate. The method may further include exposing the first photo resist layer using a first mask to form a black matrix. The first mask may include a first substantially transparent portion, a first halftone portion abutting the first substantially transparent portion, and a first blocking portion abutting the first halftone portion. A light transmittance of the first halftone portion may be greater than 0% and less than 100%. A light transmittance of the first blocking portion may be less the light transmittance of the first halftone portion. The method may further include forming a color filter on the base substrate.

In one or more embodiments, the first photo resist layer may include a negative photo resist material.

In one or more embodiments, the first mask may include a second halftone portion abutting the substantially transparent portion, a light transmittance of the second halftone portion being greater than 0% and less than 100%. The first mask may include a second blocking portion abutting the second halftone portion, a light transmittance of the second blocking portion being less than the light transmittance of the second halftone portion. The first substantially transparent portion may be disposed between the first halftone portion and the second halftone portion. The first halftone portion is disposed between the first blocking portion and the first substantially transparent portion.

In one or more embodiments, the black matrix may include a gate black matrix portion for corresponding to a gate line and a data black matrix portion for corresponding to a data line. A width of the data black matrix portion may be equal to or less than about 5 μm.

In one or more embodiments, the step of exposing the first photo resist layer may include using a proximity exposure apparatus.

In one or more embodiments, the method may include forming a second photo resist layer on the base substrate. The method may include exposing the second photo resist layer using a second mask to form a column spacer. The second mask may include a second substantially transparent portion, a second halftone portion abutting the second substantially transparent portion, and a second blocking portion abutting the second halftone portion. A light transmittance of the second halftone portion may be greater than 0% and less than 100%. A light transmittance of the second blocking portion may be less the light transmittance of the second halftone portion.

In one or more embodiments, the second photo resist layer may include a negative photo resist material.

In one or more embodiments, a width of the column spacer may be equal to or less than about 10 μm.

In one or more embodiments, the black matrix may include a gate black matrix portion for corresponding to a gate line and a data black matrix portion for corresponding to a data line. The column spacer may overlap the gate black matrix portion.

In one or more embodiments, the step of exposing the second photo resist layer may include using a proximity exposure apparatus.

In one or more embodiments, the method may include forming an overcoat layer on the black matrix and the color filter.

One or more embodiments of the present invention may be related to a mask used to precisely form a small pattern on a substrate for use in a display apparatus.

One or more embodiments of the present invention may be related to a method of manufacturing a substrate for use in a display apparatus using the mask.

In one or more embodiments, the mask includes a blocking portion, a halftone portion, and an opening portion (or substantially transparent portion). The blocking portion blocks a first portion of a light. The halftone portion is disposed adjacent to the blocking portion in a first direction. The halftone portion partially passes a second portion of the light. The opening portion is disposed adjacent to the halftone portion in the first direction. The opening portion totally passes a third portion of the light.

In an embodiment, the mask may have a first blocking portion, a first halftone portion, a first opening portion, a second halftone portion, and a second blocking portion sequentially arranged in the first direction.

In an embodiment, a light transmittance of the halftone portion may be between about 10% and about 20%

In an embodiment, a width of the halftone portion may be between half of a width of the opening portion and the width of the opening portion.

In an embodiment, the blocking portion may have a rectangular shape. Two halftone portions may be disposed at two opposite sides of the blocking portion. The opening portion may surround the blocking portion and the halftone portion.

In an embodiment, the blocking portion may have a rectangular shape. The halftone portion may have a rectangular shape surrounding the blocking portion. The opening portion may surround the halftone portion.

In an embodiment, the opening portion may have a circular shape. The halftone portion may have a circular shape surrounding the opening portion.

In an embodiment, the opening portion may have a circular shape. The halftone portion may have a rectangular shape surrounding the opening portion.

In an embodiment, the halftone portion may surround a plurality of opening portions (or a plurality of substantially transparent portions).

In one or more embodiments, the method includes forming a first photo resist layer on a base substrate, exposing the first photo resist layer using a first mask to form a black matrix, and forming a color filter on the base substrate. The first mask includes a blocking portion, a halftone portion, and an opening portion (or substantially transparent portion).

In an embodiment, the first photo resist layer may include a negative photo resist material.

In an embodiment, the first mask may have a first blocking portion, a first halftone portion, a first opening portion, a second halftone portion, and a second blocking portion sequentially arranged.

In an embodiment, the black matrix may include a gate black matrix portion for corresponding to a gate line and a data black matrix portion for corresponding to a data line. A width of the data black matrix portion may be equal to or less than about 5 μm.

In an embodiment, the first photo resist layer may be exposed using a proximity exposure apparatus.

In an embodiment, the method may further include forming a second photo resist layer on the base substrate and exposing the second photo resist layer using a second mask to form a column spacer. The second mask may include a blocking portion, a halftone portion, and an opening portion (or substantially transparent portion).

In an embodiment, the second photo resist layer may include a negative photo resist material.

In an embodiment, a width of the column spacer may be equal to or less than about 10 μm.

In an embodiment, the black matrix may include a gate black matrix portion for corresponding to a gate line and a data black matrix portion for corresponding to a data line. The column spacer may be formed overlapping the gate black matrix portion.

In an embodiment, the second photo resist layer may be exposed using a proximity exposure apparatus.

In an embodiment, the method may further include forming an overcoat layer on the black matrix and the color filter.

According to embodiments of the invention, the halftone portion may enable sufficient exposure intensity and sufficient manufacturing precision so that the black matrix may have a substantially small (or fine) pattern. Advantageously, a resolution of a display apparatus related to one or more embodiments of the invention and an aperture ratio of the display apparatus may be satisfactorily high.

BRIEF DESCRIPTION OF THE DRAWINGS

The above and other features and advantages of the present invention will become more apparent by describing in detailed embodiments with reference to the accompanying drawings, in which.

DETAILED DESCRIPTION OF THE INVENTION

Hereinafter, embodiments of the present invention will be described in further detail with reference to the accompanying drawings. Although the terms first, second, third etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, third etc. may also be used herein to differentiate different categories of elements. For conciseness, the terms first, second, third, etc. may represent first-category, second-category, third-category, etc., respectively.

Figure 1:
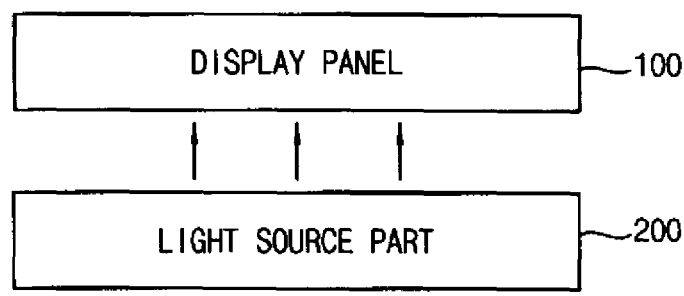
FIG. 1 is a block diagram illustrating a display apparatus according to one or more embodiments of the present invention.
Figure 2:
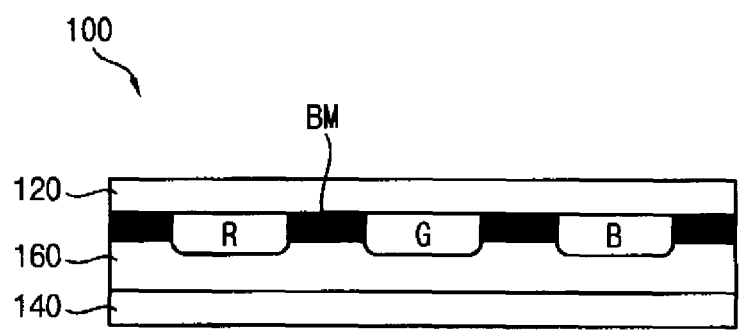
FIG. 2 is a cross-sectional view illustrating a display panel illustrated in FIG. 1.

FIG. 1 is a block diagram illustrating a display apparatus according to one or more embodiments of the present invention. FIG. 2 is a cross-sectional view illustrating a display panel illustrated in FIG. 1.

Referring to FIGS. 1 and 2, the display apparatus includes the display panel 100 and a light source part 200.

The display panel 100 includes a first substrate 120, a second substrate 140, and a liquid crystal layer 160 disposed between the substrates 120 and 140.

The first substrate 120 includes a plurality of color filters for displaying colors in response to a light provided from the light source part 200. The first substrate 120 includes a first color filter, a second color filter, and a third color filter.

For example, the first color filter may be a red color filter R. The second color filter may be a green color filter G. The third color filter may be a blue color filter B.

The first substrate 120 further includes a black matrix BM disposed between the color filters. The first substrate 120 may further include a column spacer to maintain a gap between the first substrate 120 and the second substrate 140.

Alternatively or additionally, the black matrix BM may be disposed on the second substrate 140 without overlapping the color filters R, G, and B. The column spacer may be also disposed on the second substrate 140.

Figure 3:
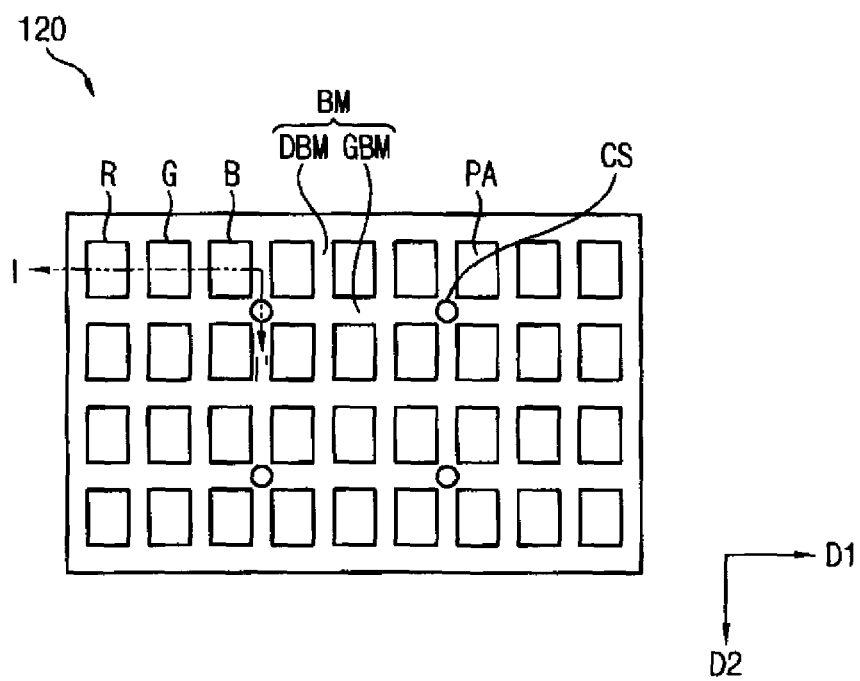
FIG. 3 is a plan view illustrating a first substrate illustrated in FIG. 2.
Figure 4:
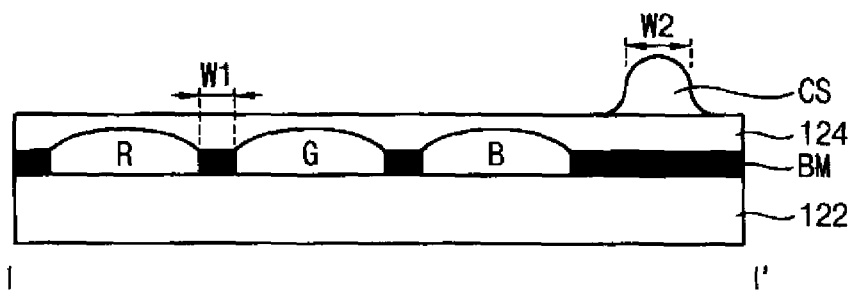
FIG. 4 is a cross-sectional view of the first substrate cut along a line I-I' indicated in FIG. 3.

A structure of the first substrate 120 is to be further explained referring to FIGS. 3 and 4.

The second substrate 140 may include a plurality of thin film transistors TFTs disposed in a matrix form. The second substrate 140 may further include a plurality of gate lines and a plurality of data lines connected to the TFTs.

In one or more embodiments, the color filters (R, G, and B), the black matrix BM, and the TFTs may be disposed on the same substrate.

The second substrate 140 may further include a pixel electrode connected to the TFT. The first substrate 120 may further include a common electrode overlapping the pixel electrode.

In one or more embodiments, the second substrate 140 may include both of the pixel electrode connected to the TFT and the common electrode overlapping the pixel electrode.

The light source part 200 may provide a light to the display panel 100. The light source part 200 may overlap (and may be disposed under) the display panel 100. The light source part 200 includes a light source for generating the light. For example, the light source part 200 may include at least one of a cold cathode fluorescent lamp ("CCFL"), an external electrode fluorescent lamp ("EEFL"), a flat fluorescent lamp ("FFL"), and a light emitting diode ("LED").

FIG. 3 is a plan view illustrating the first substrate 120 illustrated in FIG. 2.

Referring to FIGS. 2 and 3, the display panel 100 includes a plurality of pixel areas PA and a blocking portion defining the pixel areas PA. For example, the pixel areas PA are separated from each other by the blocking portion. The pixel areas PA may be disposed in a matrix form. The color filters R, G, and B are disposed in the pixel areas PA. The light blocking pattern BM is disposed in the blocking portion. The color filters R, G, and B and the black matrix BM may be disposed on the first substrate 120.

A single pixel area PA is surrounded by the black matrix BM in a plan view of the display panel 100. The pixel area PA may have one or more of various shapes.

For example, the pixel area PA may have a rectangular shape including a shorter side extending in a first direction D1 and a longer side extending in a second direction D2 substantially perpendicular to the first direction D1. Alternatively, a shorter side of the pixel area PA may extend in the second direction D2 and a longer side of the pixel area PA may extend in the first direction D1.

The black matrix BM may block a light from passing through a portion between the adjacent pixel areas PA so that lights passing through different pixel areas PA do not interfere with each other.

The black matrix BM includes a gate black matrix portion GBM corresponding to a least a gate line and a data black matrix portion DBM corresponding to at least a data line.

The first substrate 120 further includes column spacers CS. A column spacer CS may have a circular shape in a plan view of the display apparatus 100. Alternatively or additionally, one or more of the column spacers CS may have one or more other shapes in the plan view of the display apparatus 100.

The column spacers CS may be disposed in the blocking portion and may overlap the black matrix BM. For example, at least one column spacer CS may be disposed in the gate black matrix portion GBM. Alternatively or additionally, one or more column spacers CS may be disposed in one or more pixel areas PA.

FIG. 4 is a cross-sectional view of the first substrate 120 cut along a line I-I' indicated in FIG. 3.

Referring to FIGS. 2 and 4, the first substrate 120 includes a base substrate 122, the first color filter R, the second color filter G, the third color filter B, and the black matrix BM disposed between the color filters R, G, and B. The first substrate 120 may further include an overcoat layer 124 covering the color filters R, G, and B and the black matrix BM. The first substrate 120 may further include the column spacer CS to maintain a gap between the first substrate 120 and the second substrate 140.

The base substrate 122 may include glass. The base substrate 122 may include a flexible material.

The black matrix BM is disposed on the base substrate 122. The black matrix BM includes the gate black matrix portion GBM and the data black matrix portion DBM. A width of the data black matrix portion DBM may be less than a width of the gate black matrix portion GBM. A width of the data black matrix portion DBM may be less than a width of the column spacer CS. The width W1 of the data black matrix portion DBM may be equal to or less than about 5 μm.

The first color filter R is disposed on the base substrate 122. The first color filter R corresponds to a first region. The first region may be a red display region. The first region is defined by portions of the black matrix BM disposed at two or more sides of the first color filter R.

The second color filter G is disposed on the base substrate 122. The second color filter G corresponds to a second region. The second region may be a green display region. The second region is defined by portions of the black matrix BM disposed at two or more sides of the second color filter G.

The third color filter B is disposed on base substrate 122. The third color filter B corresponds to a third region. The third region may be a blue display region. The third region is defined by portions of the black matrix BM disposed at two or more sides of the third color filter B.

The overcoat layer 124 is disposed on the black matrix BM and the color filters R, G, and B. The overcoat layer 124 may planarize upper surfaces of the black matrix BM and the color filters R, G, and B.

The overcoat layer 124 may be formed corresponding to an entire surface of the base substrate 122. The overcoat layer 124 may include a transparent organic material.

The column spacer CS is disposed on the base substrate 122. The column spacer CS is disposed on the overcoat layer 124. A width W2 of the column spacer CS may be equal to or less than about 10 μm.

A side surface of the column spacer CS may have a double profile such that the side surface of the column spacer CS includes both a convex portion and a concave portion. The side surface of the column spacer CS has the double profile so that a recovery characteristic of the column spacer CS against a pressure may be satisfactory. The column spacer CS includes two concave portions and a convex portion connected between the two concave portions in the cross-sectional view of the first substrate 120 (and in a cross-sectional view of the display panel 100).

Figure 5:
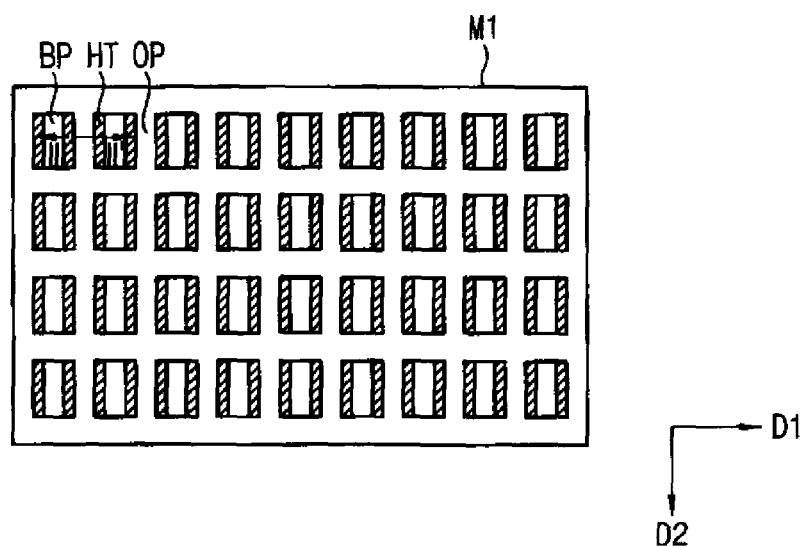
FIG. 5 is a plan view illustrating a first mask for forming a black matrix illustrated in FIG. 4.
Figure 6:
FIG. 6 is a cross-sectional view of the first mask cut along a line II-II' indicated in FIG. 5.

FIG. 5 is a plan view illustrating a first mask for forming the black matrix BM illustrated in FIG. 4. FIG. 6 is a cross-sectional view of the first mask cut along line II-IF indicated in FIG. 5.

Referring to FIGS. 3 and 5, the first mask M1 has a pattern corresponding to the shape of the black matrix BM. For example, the first mask M1 has an opening portion OP (or a substantially transparent portion) corresponding to the shape of a portion of the black matrix BM.

In one or more embodiments, the first mask M1 has a size (e.g., a length, a width, and/or an area) substantially equal to a size (e.g., a length, a width, and/or an area) of the first substrate 120. Accordingly, the black matrix BM of the first substrate 120 may be formed through a single photo resist process using the first mask M1. In one or more embodiments, the first mask M1 has a size (e.g., a length, a width, and/or an area) smaller than a size (e.g., a length, a width, and/or an area) of the first substrate 120. Accordingly, the black matrix BM of the first substrate 120 may be formed through a plurality of photo resist processes (or steps) using the first mask M1.

The first mask M1 may include a blocking portion BP, a halftone portion HT, and an opening portion OP (or substantially completely transparent portion). The opening portion OP may correspond to the data black matrix portion DBM.

The blocking portion BP may have a rectangular shape and may be disposed between two halftone portions HT. Two halftone portions HT may be respectively disposed at two opposite sides of the blocking portion BP and may respectively abut the two sides of the blocking portion BP. Each of the halftone portions HT may have a side having a length substantially equal to a length of a side of the blocking portion BP (e.g., in the second direction D2). The opening portion OP may surround the blocking portion BP and the halftone portion HT. A first halftone portion HT may be disposed between a first portion of the opening portion and the blocking portion BP; the first halftone portion HT may abut each of the first portion of the opening portion and the blocking portion BP. A second halftone portion HT may be disposed between a second portion of the opening portion and the blocking portion BP; the second halftone portion HT may abut each of the second portion of the opening portion and the blocking portion BP.

A light transmittance of the blocking portion BP is substantially 0%. A light transmittance of the opening portion OP is substantially 100%. A light transmittance of the halftone portion HT is greater than 0% and less than 100%. For example, the light transmittance of the halftone portion HT may be in a range of about 10% to about 20%.

A width of the halftone portion HT in the first direction D1 is in a range of about half of a width of the opening portion OP in the first direction D1 to about the width of the opening portion OP in the first direction D1. For example, if the width of the opening portion OP is about 5 μm, the width of a halftone portion HT disposed at a right side of the opening portion OP may be in a range of about 2.5 μm to about 5 μm, and the width of a halftone portion HT disposed at a left side of the opening portion OP may be in a range of about 2.5 μm to about 5 μm.

The width of at least a portion of the opening portion OP may be substantially equal to a desirable width of at least a portion of the black matrix BM. In one or more embodiments, the width of at least a portion of the opening portion OP may be slightly greater than or less than the desirable width of at least a portion of the black matrix BM.

Referring to FIG. 6, the first mask M1 may include a first blocking portion BP1, a first halftone portion HT1, a first opening portion OP1, a second halftone portion HT2, and a second blocking portion BP2 sequentially arranged according the first direction D1. If a width of the first opening portion OP1 is about 5 μm, a width of the first halftone portion HT1 may be in a range of about 2.5 μm to about 5 μm, and a width of the second halftone portion HT2 may be in a range of about 2.5 μm to about 5 μm.

Figure 7:
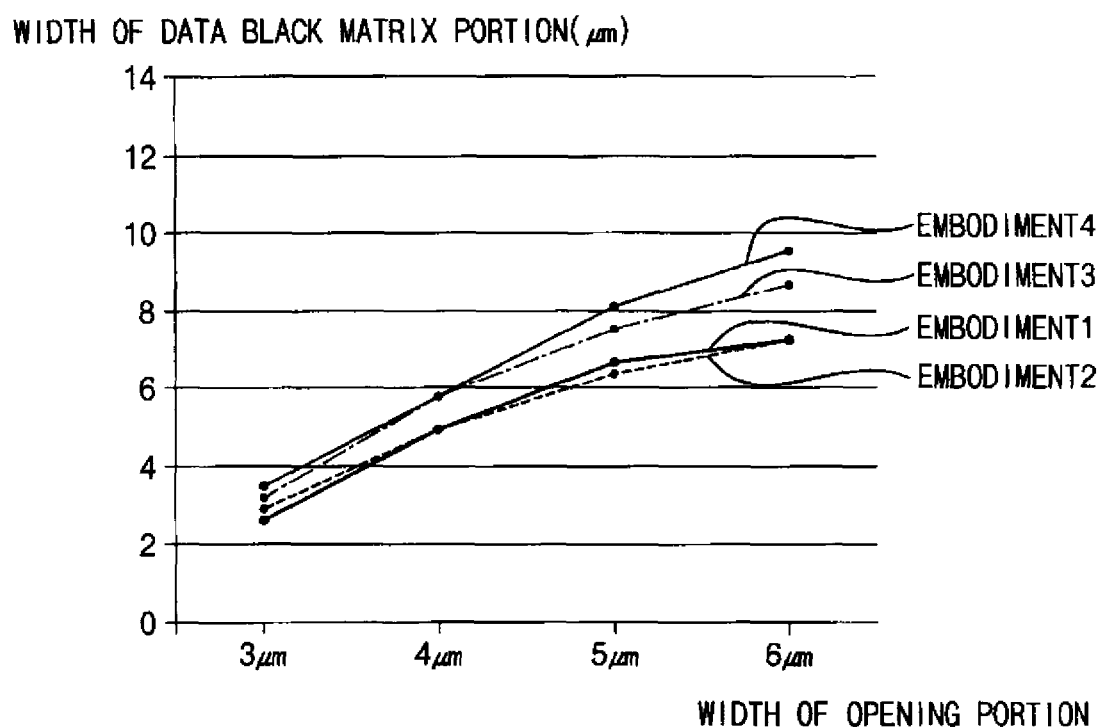
FIG. 7 is a graph illustrating a width of a pattern of the black matrix illustrated in FIG. 4 in relation to a width and a light transmittance of a halftone portion of the first mask illustrated in FIG. 5.

FIG. 7 is a graph illustrating a width of a pattern of the black matrix BM illustrated in FIG. 4 in relation to a width and a light transmittance of a halftone portion HT of the first mask M1 illustrated in FIG. 5. The width of the halftone portion HT of is related to the opening portion OP of the first mask M1.

Referring to FIG. 7, in Embodiment 1, a width of the halftone portion HT in the first direction D1 is half of a width of the opening portion OP in the first direction D1, and a light transmittance of the halftone portion HT is about 10%. In Embodiment 2, the width of the halftone portion HT in the first direction D1 is half of the width of the opening portion OP in the first direction D1, and the light transmittance of the halftone portion HT is about 20%. In Embodiment 3, the width of the halftone portion HT in the first direction D1 is equal to the width of the opening portion OP in the first direction D1, and the light transmittance of the halftone portion HT is about 10%. In Embodiment 4, the width of the halftone portion HT in the first direction D1 is equal to the width of the opening portion OP in the first direction D1, and the light transmittance of the halftone portion HT is about 20%.

Referring to Embodiment 1, when the width of the opening portion OP was about 3 μm and when the width of each of the halftone portions HT disposed at two opposite sides of the opening portion OP was about 1.5 μm, the width of the data black matrix portion DBM was about 2.6 μm. When the width of the opening portion OP was about 4 μm and when the width of each of the halftone portions HT disposed at two opposite sides of the opening portion OP was about 2 μm, the width of the data black matrix portion DBM was about 4.9 μm. When the width of the opening portion OP was about 5 μm and when the width of each of the halftone portions HT disposed at two opposite sides of the opening portion OP was about 2.5 μm, the width of the data black matrix portion DBM was about 6.6 μm. When the width of the opening portion OP was about 6 μm and when the width of each of the halftone portions HT disposed at two opposite sides of the opening portion OP was about 3 μm, the width of the data black matrix portion DBM was about 7.3 μm.

Referring to Embodiment 2, when the width of the opening portion OP was about 3 μm and when the width of each of the halftone portions HT disposed at two opposite sides of the opening portion OP was about 1.5 μm, the width of the data black matrix portion DBM was about 2.8 μm. When the width of the opening portion OP was about 4 μm and when the width of each of the halftone portions HT disposed at two opposite sides of the opening portion OP was about 2 μm, the width of the data black matrix portion DBM was about 4.9 μm. When the width of the opening portion OP was about 5 μm and when the width of each of the halftone portions HT disposed at two opposite sides of the opening portion OP was about 2.5 μm, the width of the data black matrix portion DBM was about 6.3 μm. When the width of the opening portion OP was about 6 μm and when the width of each of the halftone portions HT disposed at two opposite sides of the opening portion OP was about 3 μm, the width of the data black matrix portion DBM was about 7.3 μm.

Referring to Embodiment 3, when the width of the opening portion OP was about 3 μm and when the width of each of the halftone portions HT disposed at two opposite sides of the opening portion OP was about 3 μm, the width of the data black matrix portion DBM was about 3.2 μm. When the width of the opening portion OP was about 4 μm and when the width of each of the halftone portions HT disposed at two opposite sides of the opening portion OP was about 4 μm, the width of the data black matrix portion DBM was about 5.8 μm. When the width of the opening portion OP was about 5 μm and when the width of each of the halftone portions HT disposed at two opposite sides of the opening portion OP was about 5 μm, the width of the data black matrix portion DBM was about 7.5 μm. When the width of the opening portion OP was about 6 μm and when the width of each of the halftone portions HT disposed at two opposite sides of the opening portion OP was about 6 μm, the width of the data black matrix portion DBM was about 8.6 μm.

Referring to Embodiment 4, when the width of the opening portion OP was about 3 μm and when the width of each of the halftone portions HT disposed at two opposite sides of the opening portion OP was about 3 μm, the width of the data black matrix portion DBM was about 3.5 μm. When the width of the opening portion OP was about 4 μm and when the width of each of the halftone portions HT disposed at two opposite sides of the opening portion OP was about 4 μm, the width of the data black matrix portion DBM was about 5.8 μm. When the width of the opening portion OP was about 5 μm and when the width of each of the halftone portions HT disposed at two opposite sides of the opening portion OP was about 5 μm, the width of the data black matrix portion DBM was about 8.1 μm. When the width of the opening portion OP was about 6 μm and when the width of each of the halftone portions HT disposed at two opposite sides of the opening portion OP was about 6 μm, the width of the data black matrix portion DBM was about 9.5 μm. The data black matrix portion DBM formed using the first mask M1 may be substantially satisfactory.

Figure 8:
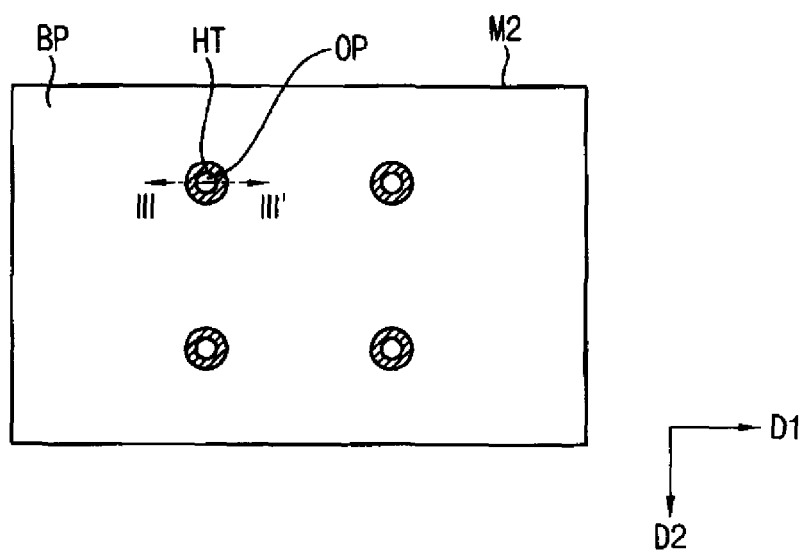
FIG. 8 is a plan view illustrating a second mask for forming at least a column spacer illustrated in FIG. 3.
Figure 9:
FIG. 9 is a cross-sectional view of the second mask cut along a line III-III' indicated in FIG. 8.

FIG. 8 is a plan view illustrating a second mask M2 for forming the column spacers CS illustrated in FIG. 3. FIG. 9 is a cross-sectional view of the second mask M2 cut along line III-III' indicated in FIG. 8.

Referring to FIGS. 3 and 8, the second mask M2 has a pattern corresponding to the shape of at least a column spacer CS. For example, the second mask M2 has an opening portion OP (or transparent portion) corresponding to the shape of the column spacer CS.

In one or more embodiments, the second mask M2 has a size (e.g., a length, a width, and/or an area) substantially same as a size (e.g., a length, a width, and/or an area) of the first substrate 120. Accordingly, the column spacer CS of the first substrate 120 may be formed through a single photo resist process using the second mask M2. In one or more embodiments, the second mask M2 has a size (e.g., a length, a width, and/or an area) smaller than a size (e.g., a length, a width, and/or an area) of the first substrate 120. Accordingly, the column spacer CS of the first substrate 120 may be formed through a plurality of photo resist processes (or steps) using the second mask M2.

The second mask M2 may include a blocking portion BP, a halftone portion HT, and an opening portion OP (or substantially completely transparent portion).

The opening portion OP of the second mask M2 may have a circular shape. The halftone portion HT may surround the opening portion OP. The halftone portion HT may have a circular shape. Specifically, the halftone portion HT may have a doughnut shape surrounding the opening portion OP and abutting the opening portion OP. The halftone portion HT and the opening portion OP may be concentric, such that a center of a circle defining a boundary of the opening portion OP may be substantially the same as a center of a circle defining a boundary of the halftone portion HT in the plan view of the second mask M2. The blocking portion BP may surround and abut the halftone portion HT.

A light transmittance of the blocking portion BP is substantially 0%. A light transmittance of the opening portion OP is substantially 100%. A light transmittance of the halftone portion HT is greater than 0% and less than 100%. For example, the light transmittance of the halftone portion HT may be in a range of about 10% to about 20%.

A width of the halftone portion HT in the first direction D1 is in a range of about half of a width of the opening portion OP in the first direction D1 to about the width of the opening portion OP in the first direction D1. For example, if the width of the opening portion OP is about 5 µm, the width of a halftone portion HT disposed at a right side of the opening portion OP may be in a range of about 2.5 µm to about 5 µm, and the width of a halftone portion HT disposed at a left side of the opening portion OP may be in a range of about 2.5 µm to about 5 µm.

A radius of the outer circle defining a boundary of the halftone portion HT may be in a range of 1.5 times to 2 times a radius of the circle defining a boundary of the opening portion OP in the plan view of the second mask M2.

The width (or diameter) at least a portion of the opening portion OP may be substantially equal to a desirable width (or diameter) of at least a portion of the column spacer CS. In one or more embodiments, the width (or diameter) of at least a portion of the opening portion OP may be slightly greater than or less than the desirable width (or diameter) of at least a portion of the column spacer CS.

Referring to FIG. 9, the second mask M2 may include the opening portion OP, the halftone portion HT surrounding the opening portion OP, and the blocking portion BP surrounding the halftone portion HT.

FIGS. 10A to 10H are cross-sectional views illustrating a method of manufacturing the first substrate 120 illustrated in FIG. 2.

Referring to FIGS. 4-6 and 10A, a first photo resist layer PR1 is formed on the base substrate 122. The first photo resist layer PR1 may include a negative photo resist material.

The first mask M1 corresponding to the shape of the black matrix BM is disposed on (or over) the first photo resist layer PR1. The first photo resist layer PR1 is exposed through the first mask M1 using an exposure apparatus. The exposure apparatus may be a proximity exposure apparatus.

The photo resist material of the first photo resist layer PR1 reacts with the light passing through the opening portion OP and the halftone portion HT of the first mask M1.

Referring to FIGS. 4-6, 10A, and 10B, the first photo resist layer PR1 is developed to form the black matrix BM. The first photo resist layer PR1 includes a negative photo resist material so that a portion exposed by the light through the opening portion OP and the halftone portion HT remains.

The shape of the black matrix BM may substantially correspond to a shape of the opening portion OP of the first mask M1. The width of the black matrix BM may be substantially corresponding to a width of the opening portion OP of the first mask M1.

The light from the exposure apparatus may be slightly inclined with respect to a direction perpendicular to the first mask M1 so that the light may irradiate an area wider than an area of the opening portion OP and that, due to diffraction and interference, an area corresponding to the opening portion OP might lack exposure intensity if the first mask M1 did not include the halftone portion HT.

In one or more embodiments, the halftone portion HT is formed adjacent to and abutting the opening portion OP so that the intensity of the light in the area of the first photo resist layer PR1 corresponding to the opening portion OP may be sufficient. As can be appreciated from FIG. 10A and FIG. 10B, an area of the first photo resist layer PR1 corresponding to the halftone portion HT may be substantially removed such that a width of the black matrix BM may be minimized; a portion of the area of the first photo resist layer PR1 corresponding to the vicinity of a boundary between the halftone portion HT and the opening portion OP may remain so that the area corresponding to the halftone portion HT functions as a buffer to protect the pattern corresponding to the opening portion OP from undesired damage. Thus, the black matrix BM having a small pattern may be precisely formed.

In one or more embodiments, the black matrix BM is formed before forming the color filters R, G, and B. In one or more embodiments, the black matrix BM may be formed after forming the color filters R, G, and B and formed corresponding to boundaries of the color filters R, G, and B.

Figure 10A:
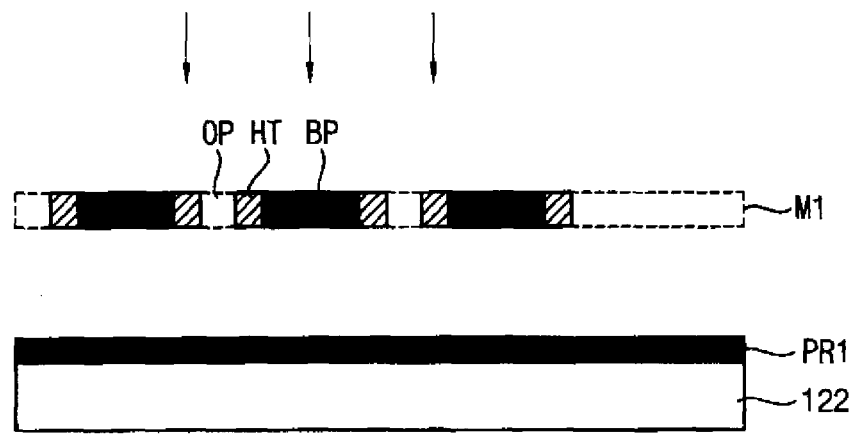
FIGS. 10A to 10H are cross-sectional views illustrating a method of manufacturing the first substrate illustrated in FIG. 2.
Figure 10B:
Figure 10C:

Referring to FIGS. 4 and 10C, the first color filter R is formed on the base substrate 122 in the first region. The first color filter R may be formed using a photo resist material including a red pigment. The first color filter R may be formed using a mask having a shape corresponding to the first color filter R through one or more of a light exposure process and a develop process.

Figure 10D:

Referring to FIGS. 4 and 10D, the second color filter G is formed on the base substrate 122 in the second region. The second color filter G may be formed using a photo resist material including a green pigment. The second color filter G may be formed using a mask having a shape corresponding to the second color filter G through one or more of a light exposure process and a develop process.

Figure 10E:

Referring to FIGS. 4 and 10E, the third color filter B is formed on the base substrate 122 in the third region. The third color filter B may be formed using a photo resist material including a blue pigment. The third color filter B may be formed using a mask having a shape corresponding to the third color filter B through one or more of a light exposure process and a develop process.

Figure 10F:
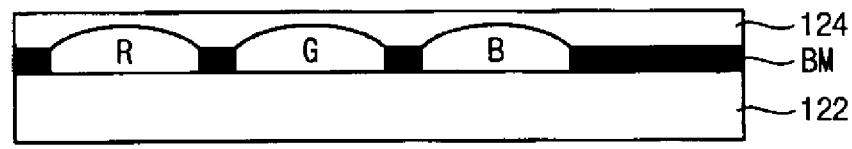
Figure 10G:
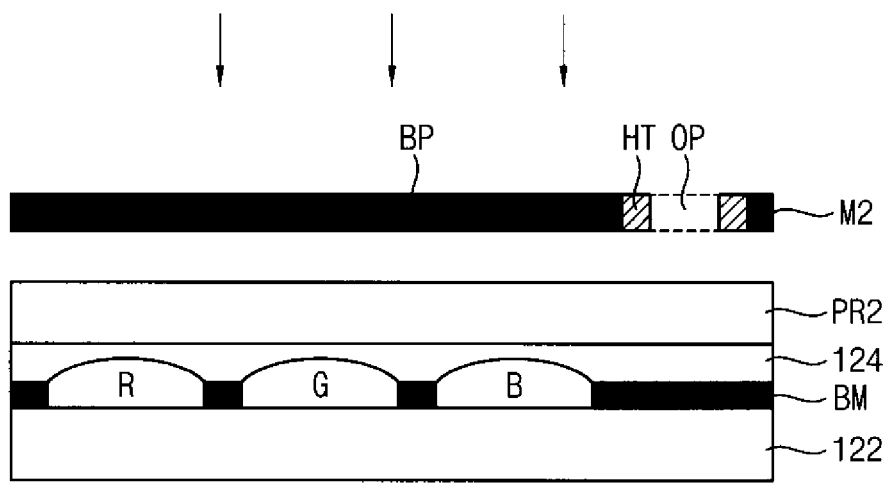
Figure 10H:
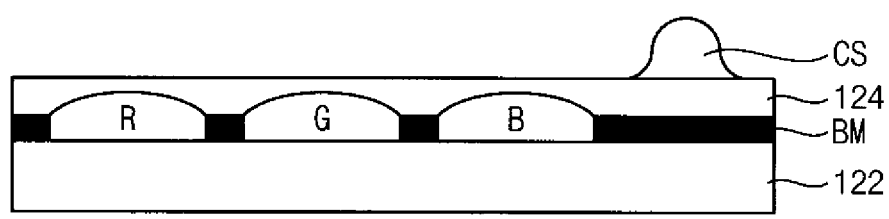

Referring to FIGS. 4 and 10F, the overcoat layer 124 is formed on the color filters R, G, and B and the black matrix BM. The upper surfaces of the black matrix BM and the color filters R, G, and B may be planarized by the overcoat layer 124.

The overcoat layer 124 may be coated corresponding to an entire surface of the base substrate 122. The overcoat layer 124 may include a transparent organic material.

Referring to FIGS. 4, 8, 9, and 10G, a second photo resist layer PR2 is formed on the overcoat layer 124 on the base substrate 122. The second photo resist layer PR2 may include a negative photo resist material.

The second mask M2 corresponding to the shape of the column spacer CS is disposed on (or over) the second photo resist layer PR2. The second photo resist layer PR2 is exposed through the second mask M2 using an exposure apparatus. The exposure apparatus may be a proximity exposure apparatus.

The photo resist material of the second photo resist layer PR2 reacts with the light passing through the opening portion OP and the halftone portion HT of the second mask M2.

Referring to FIGS. 4, 8, 9, 10G, and 10H, the second photo resist layer PR2 is developed to form the column spacer CS. The second photo resist layer PR2 includes a negative photo resist material so that a portion of the second photo resist layer PR2 exposed by the light through the opening portion OP and the halftone portion HT remains.

The shape of the column spacer CS (in a plan view of the first substrate 120) may substantially correspond to a shape of the opening portion OP of the second mask M2 (in a plan view of the second mask M2). The width (or diameter) of the column spacer CS may be substantially corresponding to a width (or diameter) of the opening portion OP of the second mask M2.

The light from the exposure apparatus may be slightly inclined with respect to a direction perpendicular to the second mask M2 so that the light may irradiate an area of the second photo resist layer PR2 wider than an area of the opening portion OP and that, due to diffraction and interference, an area of the second photo resist layer PR2 corresponding to the opening portion OP might lack exposure intensity if the second mask M2 did not include the halftone portion HT.

In one or more embodiments, the halftone portion HT is formed adjacent to, surrounding, and abutting the opening portion OP so that the intensity of the light in the area of the second photo resist layer PR2 corresponding to the opening portion OP may be sufficient. As can be appreciated from FIG. 10G and FIG. 10H, an area of the second photo resist layer PR2 corresponding to the halftone portion HT may be substantially removed such that a dimension of the column spacer CS may be minimized; a portion of the second photo resist layer PR2 corresponding to the vicinity of a boundary between the halftone portion HT and the opening portion OP may remain so that the area corresponding to the halftone portion HT functions as a buffer to protect the pattern corresponding to the opening portion OP from undesired damage. Thus, the column spacer CS having a small pattern may be precisely formed.

The side surface of the column spacer CS may have a double profile such that the side surface of the column spacer CS includes both a convex portion and a concave portion. The side surface of the column spacer CS has the double profile so that a recovery characteristic of the column spacer CS against a pressure may be satisfactory. The column spacer CS includes two concave portions and a convex portion connected between the two concave portions in the cross-sectional view of the first substrate 120 (and in a cross-sectional view of the display panel 100).

Figure 11:
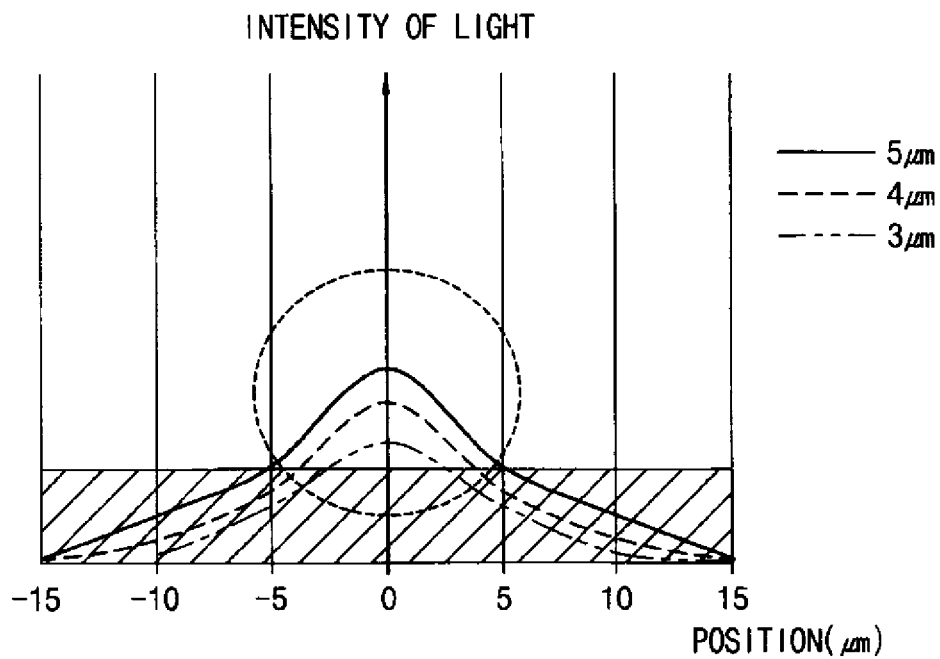
FIG. 11 is a graph illustrating an intensity profile of a light passing through the first mask of FIG. 5 and irradiating a first photo resist layer illustrated in FIG. 10A.

FIG. 11 is a graph illustrating an intensity profile of a light passing through the first mask M1 illustrated in FIG. 5 and irradiating the first photo resist layer PR1 illustrated in FIG. 10A.

Referring to FIGS. 10A and 11, when the intensity of the light irradiating the first photo resist layer PR1 does not exceed a lift-off limit (which is indicated by the upper boundary of the hatched area in FIG. 11), the first photo resist layer PR1 is lifted off (and substantially removed) in a develop process.

The halftone portion HT of the first mask M1 is formed adjacent to the opening portion OP of the first mask M1 so that the intensity of the light in a central portion of the area corresponding to the opening portion OP may be substantially higher than the intensity in an area corresponding to the blocking portion BP and may be sufficient for forming the black matrix BM. Thus, the black matrix BM having a width less than about 5 μm may be formed.

The intensity of the light in the area of the first photo resist layer PR1 corresponding to the halftone portion HT is under the lift-off limit so that the area of the first photo resist layer PR1 corresponding to the halftone portion HT is substantially removed in the develop process. Advantageously, a width of the black matrix BM may be minimized. The intensity of the light in an portion of the first photo resist layer PR1 corresponding to the vicinity of a boundary between the halftone portion HT and the opening portion OP may be near or above the lift-off limit such that the portion of the first photo resist layer PR1 may remain. Thus, the area corresponding to the halftone portion HT functions as a buffer to protect the pattern corresponding to the opening portion OP from undesired damage. Therefore, the black matrix BM having a small pattern may be precisely formed.

In one or more embodiments, the black matrix BM and the column spacer CS of the first substrate 120 have small patterns. In one or more embodiments, one or more of various patterns of the substrates of various dimensions may be formed.

According to embodiments of the invention, the black matrix BM and the column spacer CS having small patterns may be precisely formed. Advantageously, both a resolution of the display apparatus and an aperture ratio of the display apparatus may be satisfactorily high.

Figure 12:
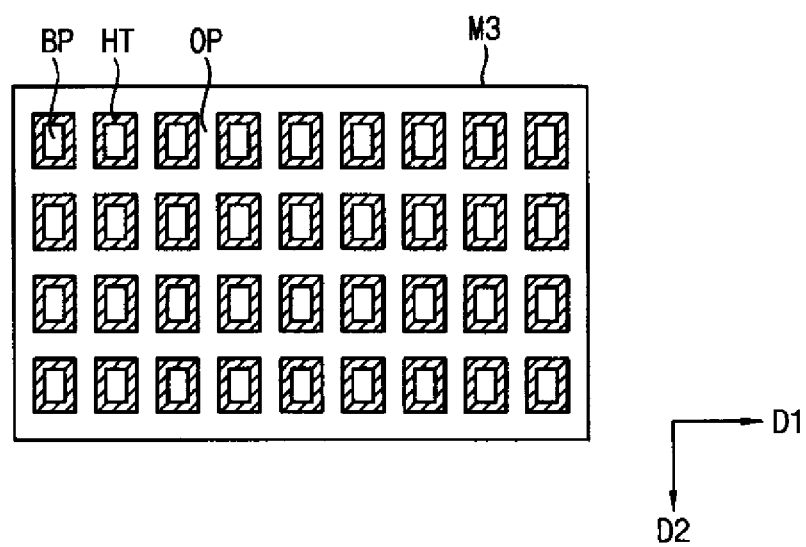
FIG. 12 is a plan view illustrating a third mask for forming a black matrix according to one or more embodiments of the present invention.

FIG. 12 is a plan view illustrating a third mask M3 for forming a black matrix BM according to one or more embodiments of the present invention.

The method of manufacturing a substrate using the third mask M3 may be substantially as analogous to the method of manufacturing a substrate explained with reference to FIGS. 1 to 11 except for the mask used for forming a black matrix BM. Thus, the same reference numerals may be used to refer to the same or like parts as those described in FIGS. 1 to 11, and repetitive explanation concerning the above elements may be omitted.

Referring to FIGS. 3 and 12, the third mask M3 has a pattern corresponding to the shape of the black matrix BM. For example, the third mask M3 has an opening portion OP corresponding to the shape of a portion of the black matrix BM.

The third mask M3 may include a blocking portion BP, a halftone portion HT, and an opening portion OP (or substantially completely transparent portion). A portion of the opening portion OP may correspond to the data black matrix portion DBM. A portion of the opening portion OP may correspond to the gate black matrix portion GBM.

The blocking portion BP may have a rectangular shape. The halftone portion HT may have a hollow rectangular shape surrounding and abutting the blocking portion BP. The opening portion HT may surround and abut the halftone portion HT.

A light transmittance of the blocking portion BP is substantially 0%. A light transmittance of the opening portion OP is substantially 100%. A light transmittance of the halftone portion HT is greater than 0% and less than 100%. For example, the light transmittance of the halftone portion HT may be in a range of about 10% to about 20%.

A width of the halftone portion HT in the first direction D1 is in a range of about half of a width of the opening portion OP in the first direction D1 to about the width of the opening portion OP in the first direction D1. A width of the halftone portion HT in the second direction D2 is in a range of about half of a width of the opening portion OP in the second direction D2 to about the width of the opening portion OP in the second direction D2.

The width of at least a portion the opening portion OP may be substantially equal to a desirable width of at least a portion of the black matrix BM. In one or more embodiments, the width of at least a portion of the opening portion OP may be slightly greater than or less than the desirable width of at least a portion of the black matrix BM.

Referring to FIGS. 4, 10A, 10B, and 12, a first photo resist layer PR1 is formed on the base substrate 122. The first photo resist layer PR1 may include a negative photo resist material.

The third mask M3 corresponding to the shape of the black matrix BM is disposed on (or over) the first photo resist layer PR1. The first photo resist layer PR1 is exposed through the third mask M3 using an exposure apparatus. The exposure apparatus may be a proximity exposure apparatus.

The photo resist material of the first photo resist layer PR1 reacts with the light passing through the opening portion OP and the halftone portion HT of the third mask M3.

The first photo resist layer PR1 is developed to form the black matrix BM.

The light from the exposure apparatus may be slightly inclined with respect to a direction perpendicular to the third mask M3 so that the light may irradiate an area wider than an area of the opening portion OP and that, due to diffraction and interference, an area corresponding to the opening portion OP might lack exposure intensity if the third mask M3 did not include the halftone portion HT.

In one or more embodiments, the halftone portion HT is formed adjacent to and abutting the opening portion OP so that the intensity of the light in the area of the first photo resist layer PR1 corresponding to the opening portion OP may be sufficient. As can be appreciated from FIG. 10A and FIG. 10B, an area of the first photo resist layer PR1 corresponding to the halftone portion HT may be substantially removed such that a width of the black matrix BM may be minimized; a portion of the area of the first photo resist layer PR1 corresponding to the vicinity of a boundary between the halftone portion HT and the opening portion OP may remain so that the area corresponding to the halftone portion HT functions as a buffer to protect the pattern corresponding to the opening portion OP from undesired damage. Thus, the black matrix BM having a small pattern may be precisely formed.

According to embodiments of the invention, the black matrix BM and the column spacer CS having small patterns may be precisely formed. Advantageously, both a resolution of the display apparatus and an aperture ratio of the display apparatus may be satisfactorily high.

Figure 13:
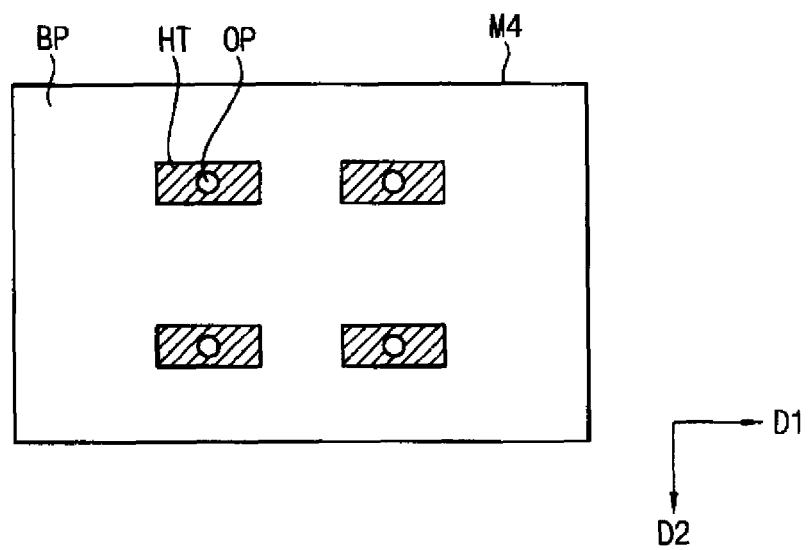
FIG. 13 is a plan view illustrating a fourth mask for forming a column spacer according to one or more embodiments of the present invention.

FIG. 13 is a plan view illustrating a fourth mask M4 for forming a column spacer CS according to one or more embodiments of the present invention.

The method of manufacturing a substrate using the fourth mask M4 may be substantially as analogous to the method of manufacturing a substrate explained with reference to FIGS. 1 to 11 except for the mask used for forming a column spacer CS. Thus, the same reference numerals may be used to refer to the same or like parts as those described in FIGS. 1 to 11, and repetitive explanation concerning the above elements may be omitted.

Referring to FIGS. 3 and 13, the fourth mask M4 has a pattern corresponding to the shape of the column spacer CS. For example, the fourth mask M4 has an opening portion OP (or substantially completely transparent portion) corresponding to the shape of the column spacer CS.

The fourth mask M4 may include a blocking portion BP, a halftone portion HT, and an opening portion OP.

The opening portion OP of the fourth mask M4 may have a circular shape. The halftone portion HT may surround and abut the opening portion OP. The halftone portion HT may have a rectangular shape. Specifically, the halftone portion HT may have a rectangular shape including a hole corresponding to the circular opening portion OP in a center portion of the halftone portion HT. The halftone portion HT and the opening portion OP may be concentric, such that a center of a circle defining a boundary of the opening portion OP may be substantially the same as a center of a rectangle defining a boundary of the halftone portion HT. In one or more embodiments, the halftone portion HT may have a longer side extending in the first direction D1. In one or more embodiments, the halftone portion HT may have a longer side extending in the second direction D2. In one or more embodiments, the halftone portion HT may have a square shape. According to one or more embodiments, the halftone portion HT may have a wide process error margin so that the halftone portion HT may be easily formed.

A light transmittance of the blocking portion BP is substantially 0%. A light transmittance of the opening portion OP is substantially 100%. A light transmittance of the halftone portion HT is greater than 0% and less than 100%. For example, the light transmittance of the halftone portion HT may be in a range of about 10% to about 20%.

The width (or diameter) of at least a portion of the opening portion OP may be substantially equal to a desirable width (or diameter) of at least a portion of the column spacer CS. In one or more embodiments, the width (or diameter) of at least a portion of the opening portion OP may be slightly greater than or less than the desirable width (or diameter) of at least a portion of the column spacer CS.

Referring to FIGS. 4, 10G, 10H, and 13, a second photo resist layer PR2 is formed on the overcoat layer 124 on the base substrate 122. The second photo resist layer PR2 may include a negative photo resist material.

The fourth mask M4 corresponding to the shape of the column spacer CS is disposed on (or over) the second photo resist layer PR2. The second photo resist layer PR2 is exposed through the fourth mask M4 using an exposure apparatus. The exposure apparatus may be a proximity exposure apparatus.

The photo resist material of the second photo resist layer PR2 reacts with the light passing through the opening portion OP and the halftone portion HT of the fourth mask M4.

The second photo resist layer PR2 is developed to form the column spacer CS.

The light from the exposure apparatus may be slightly inclined with respect to a direction perpendicular to the fourth mask M4 so that the light may irradiate an area of the second photo resist layer PR2 wider than an area of the opening portion OP and that, due to diffraction and interference, an area of the second photo resist layer PR2 corresponding to the opening portion OP might lack exposure intensity if the fourth mask M4 did not include the halftone portion HT.

In one or more embodiments, the halftone portion HT is formed adjacent to, surrounding, and abutting the opening portion OP so that the intensity of the light in the area of the second photo resist layer PR2 corresponding to the opening portion OP may be sufficient. As can be appreciated from FIG. 10G and FIG. 10H, an area of the second photo resist layer PR2 corresponding to the halftone portion HT may be substantially removed such that a dimension of the column spacer CS may be minimized; a portion of the second photo resist layer PR2 corresponding to the vicinity of a boundary between the halftone portion HT and the opening portion OP may remain so that the area corresponding to the halftone portion HT functions as a buffer to protect the pattern corresponding to the opening portion OP from undesired damage. Thus, the column spacer CS having a small pattern may be precisely formed.

According to embodiments of the invention, the black matrix BM and the column spacer CS having small patterns may be precisely formed. Advantageously, both a resolution of the display apparatus and an aperture ratio of the display apparatus may be satisfactorily high.

Figure 14:
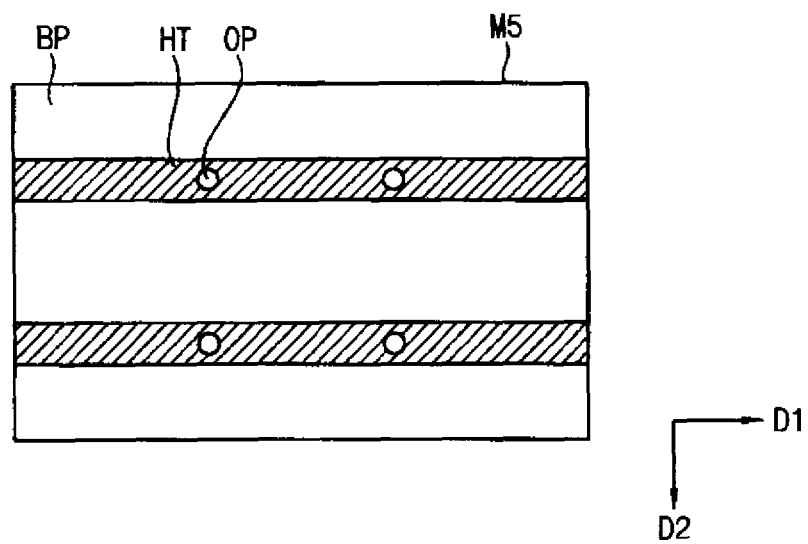
FIG. 14 is a plan view illustrating a fifth mask for forming a column spacer according to one or more embodiments of the present invention.

FIG. 14 is a plan view illustrating a fifth mask M5 for forming a column spacer CS according to one or more embodiments of the present invention.

The method of manufacturing a substrate using the fifth mask M5 may be substantially as analogous to the method of manufacturing the substrate explained with reference to FIGS. 1 to 11 except for the mask used for forming a column spacer CS. Thus, the same reference numerals may be used to refer to the same or like parts as those described in FIGS. 1 to 11, and repetitive explanation concerning the above elements may be omitted.

Referring to FIGS. 3 and 14, the fifth mask M5 has a pattern corresponding to the shape of the column spacer CS. For example, the fifth mask M5 has an opening portion OP (or substantially completely transparent portion) corresponding to the shape of the column spacer CS.

The fifth mask M5 may include a blocking portion BP, a halftone portion HT, and an opening portion OP.

The opening portion OP of the fifth mask M5 may have a circular shape. The halftone portion HT may surround and abut the opening portion OP. The halftone portion HT may have a rectangular shape. Specifically, the halftone portion HT may have a rectangular shape including a hole corresponding to the circular opening portion OP. In one or more embodiments, the halftone portion HT may surround a plurality of opening portions OP (which may be aligned along the first direction D1). In one or more embodiments, a length of the halftone portion HT may be substantially equal to a length of a side of the fifth mask M5.

In one or more embodiments, the halftone portion HT may have a longer side extending in the first direction D1. In one or more embodiments, the halftone portion HT may have a longer side extending in the second direction D2. According to one or more embodiments, the halftone portion HT may have a wide process error margin so that the halftone portion HT may be easily formed.

A light transmittance of the blocking portion BP is substantially 0%. A light transmittance of the opening portion OP is substantially 100%. A light transmittance of the halftone portion HT is greater than 0% and less than 100%. For example, the light transmittance of the halftone portion HT may in a range of about 10% to about 20%.

The width (or diameter) of at least a portion of the opening portion OP may be substantially equal to a desirable width (or diameter) of at least a portion of the column spacer CS. In one or more embodiments, the width (or diameter) of at least a portion of the opening portion OP may be slightly greater than or less than the desirable width (or diameter) of at least a portion of the column spacer CS.

Referring to FIGS. 4, 10G, 10H, and 14, a second photo resist layer PR2 is formed on the overcoat layer 124 on the base substrate 122. The second photo resist layer PR2 may include a negative photo resist material.

The fifth mask M5 corresponding to the shape of the column spacer CS is disposed on (or over) the second photo resist layer PR2. The second photo resist layer PR2 is exposed through the fifth mask M5 using an exposure apparatus. The exposure apparatus may be a proximity exposure apparatus.

The photo resist material of the second photo resist layer PR2 reacts with the light passing through the opening portion OP and the halftone portion HT of the fifth mask M5.

The second photo resist layer PR2 is developed to form the column spacer CS.

The light from the exposure apparatus may be slightly inclined with respect to a direction perpendicular to the fifth mask M5 so that the light may irradiate an area of the second photo resist layer PR2 wider than an area of the opening portion OP and that, due to diffraction and interference, an area of the second photo resist layer PR2 corresponding to the opening portion OP might lack exposure intensity if the fifth mask M5 did not include the halftone portion HT.

In one or more embodiments, the halftone portion HT is formed adjacent, surrounding, and abutting to the opening portion OP so that the intensity of the light in the area of the second photo resist layer PR2 corresponding to the opening portion OP may be sufficient. As can be appreciated from FIG. 10G and FIG. 10H, an area of the second photo resist layer PR2 corresponding to the halftone portion HT may be substantially removed such that a dimension of the column spacer CS may be minimized; a portion of the second photo resist layer PR2 corresponding to the vicinity of a boundary between the halftone portion HT and the opening portion OP may remain so that the area corresponding to the halftone portion HT functions as a buffer to protect the pattern corresponding to the opening portion OP from undesired damage. Thus, the column spacer CS having a small pattern may be precisely formed.

According to embodiments of the invention, the black matrix BM and the column spacer CS having small patterns may be precisely formed. Advantageously, both a resolution of the display apparatus and an aperture ratio of the display apparatus may be improved satisfactorily high.

According to embodiments of the present invention explained above, a small pattern may be precisely formed. Advantageously, a resolution of the display apparatus and an aperture ratio of a display apparatus according to one or more embodiments of the invention may be substantially higher than a comparable conventional display apparatus.

The foregoing is illustrative of embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of embodiments of the present invention and is not to be construed as limited to the specific example embodiments disclosed, and that modifies to the disclosed example embodiments, as well as other example embodiments, are intended to be included within the scope of the appended claims. The present invention is defined by the following claims, with equivalents of the claims to be included therein.

What is claimed is:

1. A mask comprising:
   a substantially transparent portion;
   a first halftone portion abutting the substantially transparent portion, a light transmittance of the first halftone portion being greater than 0% and less than 100%; and
   a first blocking portion abutting the first halftone portion, a light transmittance of the first blocking portion being substantially 0%, wherein the substantially transparent portion surrounds the first blocking portion.

2. The mask of claim 1, further comprising:
   a second halftone portion abutting the substantially transparent portion, a light transmittance of the second halftone portion being greater than 0% and less than 100%; and a second blocking portion abutting the second halftone portion, a light transmittance of the second blocking portion being less than the light transmittance of the second halftone portion, wherein the substantially transparent portion is disposed between the first halftone portion and the second halftone portion, and wherein the first halftone portion is disposed between the first blocking portion and the substantially transparent portion.

3. The mask of claim 1, wherein the light transmittance of the first halftone portion is in a range of about 10% to about 20%.

4. The mask of claim 1, wherein a width of the first halftone portion is in a range of half of a width of the substantially transparent portion to the width of the substantially transparent portion.

5. The mask of claim 1, further comprising:

a second halftone portion abutting the substantially transparent portion, a light transmittance of the second halftone portion being greater than 0% and less than 100%, wherein the first blocking portion is disposed between the first halftone portion and the second halftone portion, and the substantially transparent portion surrounds the first blocking portion, the first halftone portion, and the second halftone portion.

6. The mask of claim 1, wherein the first blocking portion has a rectangular shape, wherein the first halftone portion has a rectangular shape and surrounds the first blocking portion, and wherein the substantially transparent portion surrounds the first halftone portion.

7. A mask comprising:

a substantially transparent portion;

a first halftone portion abutting the substantially transparent portion, a light transmittance of the first halftone portion being greater than 0% and less than 100%; and a first blocking portion abutting the first halftone portion, a light transmittance of the first blocking portion being substantially 0%, wherein the first halftone portion surrounds the substantially transparent portion.

8. The mask of claim 7, wherein the substantially transparent portion has a circular shape, and wherein the first halftone portion has a rectangular shape or a circular shape.

9. The mask of claim 8, further comprising a second substantially transparent portion, wherein the first halftone portion further surrounds the second substantially transparent portion, and wherein a portion of the first halftone portion is disposed between the substantially transparent portion and the second substantially transparent portion.

* * * * *